United States Patent
Bushard et al.

(10) Patent No.: US 7,797,600 B2
(45) Date of Patent: *Sep. 14, 2010

(54) METHOD AND APPARATUS FOR TESTING A RING OF NON-SCAN LATCHES WITH LOGIC BUILT-IN SELF-TEST

(75) Inventors: Louis B. Bushard, Rochester, MN (US); Nathan P. Chelstrom, Cedar Park, TX (US); Naoki Kiryu, Machida (JP); David J. Krolak, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 232 days.

This patent is subject to a terminal disclaimer.

(21) Appl. No.: 12/139,114

(22) Filed: Jun. 13, 2008

(65) Prior Publication Data

US 2008/0250290 A1 Oct. 9, 2008

Related U.S. Application Data

(63) Continuation of application No. 11/278,313, filed on Mar. 31, 2006, now Pat. No. 7,406,640.

(51) Int. Cl.
*G01R 31/28* (2006.01)
(52) U.S. Cl. ........................... 714/726; 714/733
(58) Field of Classification Search .................. 326/93; 713/500; 714/726, 733, 727, 729, 718
See application file for complete search history.

(56) References Cited

U.S. PATENT DOCUMENTS

| 5,329,533 | A | 7/1994 | Lin |
| 5,623,503 | A | 4/1997 | Rutkowski |
| 5,838,693 | A | 11/1998 | Morley |
| 6,539,491 | B1 | 3/2003 | Skergan et al. |
| 6,570,407 | B1 * | 5/2003 | Sugisawa et al. ............. 326/93 |
| 6,681,356 | B1 | 1/2004 | Gerowitz et al. |
| 6,986,114 | B2 | 1/2006 | Patzer et al. |
| 7,000,164 | B2 * | 2/2006 | Siegel et al. ................. 714/731 |
| 7,305,602 | B2 * | 12/2007 | Chan et al. .................. 714/726 |
| 7,478,297 | B2 * | 1/2009 | Chan et al. .................. 714/726 |
| 2005/0033898 | A1 | 2/2005 | Anderson et al. |
| 2005/0050418 | A1 | 3/2005 | Gass |

* cited by examiner

*Primary Examiner*—David Ton
(74) *Attorney, Agent, or Firm*—Yee & Associates, P.C.; Matthew B. Talpis

(57) ABSTRACT

A method and apparatus for loading a ring of non-scan latches for a logic built-in self-test. A logic built-in self-test value is loaded into a scannable latch from the logic built-in self-test. An override control signal is asserted in response to loading the logic built-in self-test value into the scannable latch. A non-scan latch is forced to load the logic built-in self-test value from the scannable latch in response to asserting the override control signal. Logic paths in the ring of non-scan latches are exercised. The non-scan latch is part of the logical paths. The test results are captured from the logic paths and the test results are compared against expected test results to determine if the logic paths within the ring of non-scan latches are functioning properly.

14 Claims, 7 Drawing Sheets

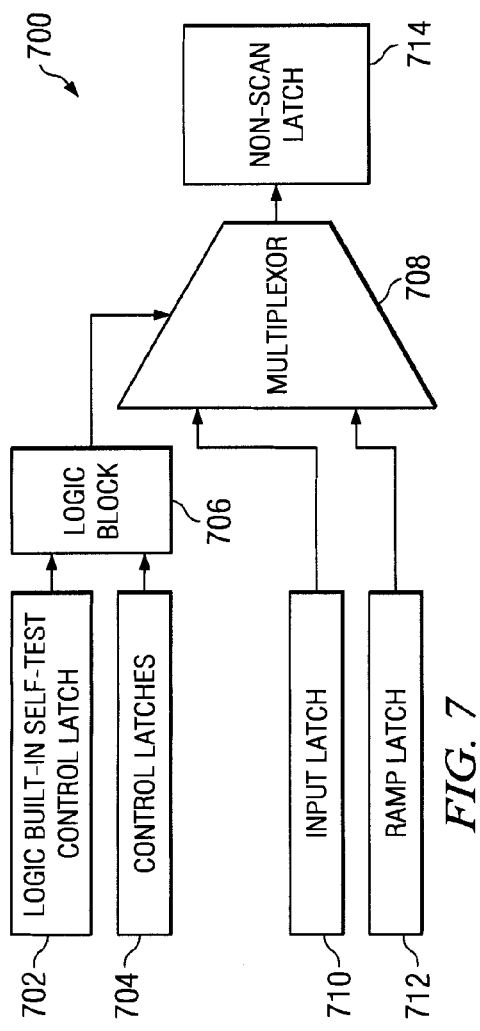
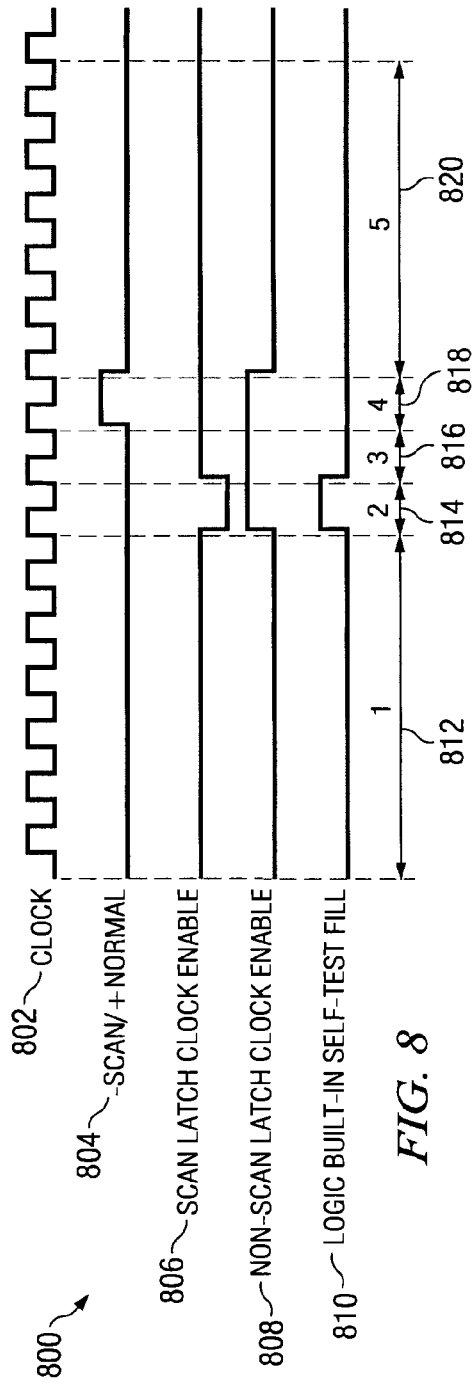

METHOD AND APPARATUS FOR TESTING A RING OF NON-SCAN LATCHES WITH LOGIC BUILT-IN SELF-TEST

This application is a continuation of application number 11/278,313, filed Mar. 31, 2006, status allowed.

BACKGROUND

1. Field of the Invention

The present application relates generally to data processing, and more particularly to a computer implemented method and apparatus for testing a ring of non-scan latches with logic built-in self-test.

2. Description of the Related Art

Data processing systems use increasingly complex circuitry, logic, and other electronic components to efficiently process data. Many times, it is financially advantageous to build computer chips that may be tested with on board logic built-in self-test (LBIST). Conventional logic built-in self-test allows chips to be tested and reevaluated when installed, during start-up, or at any other time. Logic built-in self-test helps diagnose fabrication problems more effectively, saving time and money.

However, logic built-in self-test requires the ability to scan or shift data through latch elements of a design in order to load logic built-in self-test patterns and to capture the test results afterwards. The logic built-in self-test test patterns are loaded into the logic to ensure that the logic is functioning properly and to create the expected test data or results. Scannable latches allow data values to be directly loaded to the scannable latch. Non-scan latches are not directly loadable. As a result, a non-scan latch must have a value clocked in. Scannable latches require more area and may be slightly slower than non-scan latches. As a result, it is financially advantageous to use as large a proportion of non-scan latches as possible.

In order to be able to test non-scan latches with logic built-in self-test, the depth of non-scan latches is typically limited to a depth of three or less in a data pipeline. Additionally, no loop-backs from non-scan latches could be tested because such loops prevented loading predictable values in the non-scan latches from predictable scan latches. A loop back refers to an output of a non-scan latch interconnect to an input of another non-scan latch which is located before the non-scan latch with respect to data flow.

Consequently, a series of non-scan latches or multiple non-scan latches configured in a loop or ring is called a ring of non-scan latches. Testing of this type of circuit has been discouraged because the ring of non-scan latches appears as an infinite number of non-scan latches to the logic built-in self-test. The infinite appearance of the ring of non-scan latches violates the depth limit and no loop requirements of logic built-in self-test. Consequently, testing rings of non-scan latches using logic built-in self-test has been impracticable.

SUMMARY

The illustrative embodiments provide a method and apparatus for a logic built-in self-test. A logic built-in self-test value is loaded into a scannable latch from the logic built-in self-test. An override control signal is asserted in response to loading the logic built-in self-test value into the scannable latch. A non-scan latch is forced to load the logic built-in self-test value from the scannable latch in response to asserting the override control signal. Logic paths in the ring of non-scan latches are exercised. The non-scan latch is part of the logical paths. The test results are captured from the logic paths and the test results are compared against expected test results to determine if the logic paths within the ring of non-scan latches are functioning properly.

BRIEF DESCRIPTION OF THE DRAWINGS

The novel features believed characteristic of the illustrative embodiments are set forth in the appended claims. The illustrative embodiments themselves, however, as well as a preferred mode of use, further objectives and advantages thereof, will best be understood by reference to the following detailed description of the illustrative embodiments when read in conjunction with the accompanying drawings, wherein:

FIG. 7 is a block diagram of a non-scan latch stage for use with logic built-in self-test in accordance with an illustrative embodiment;

FIG. 8 is a timing diagram illustrating loading a non-scan latch in accordance with an illustrative embodiment.

DETAILED DESCRIPTION OF THE PREFERRED EMBODIMENT

Figure 1:
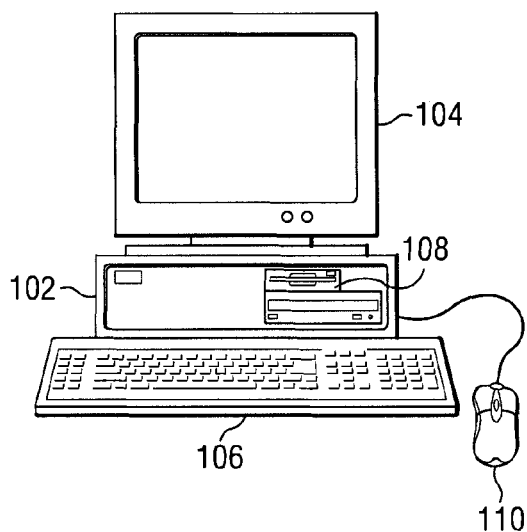
FIG. 1 is a pictorial representation of a data processing system in which illustrative embodiments may be implemented.

With reference now to the figures and in particular with reference to FIG. 1, a pictorial representation of a data processing system is shown in which the illustrative embodiments may be implemented. Computer 100 is depicted which includes system unit 102, video display terminal 104, keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 may be any suitable computer, such as an IBM® eServer computer or IntelliStation® computer, which are products of International Business Machines Corporation, located in Armonk, N.Y. Although the depicted representation shows a personal computer, other embodiments may be implemented in other types of data processing systems, such as a network computer. Computer 100 also preferably includes a graphical user interface (GUI) that may be implemented by means of systems software residing in computer readable media in operation within computer 100.

Figure 2:
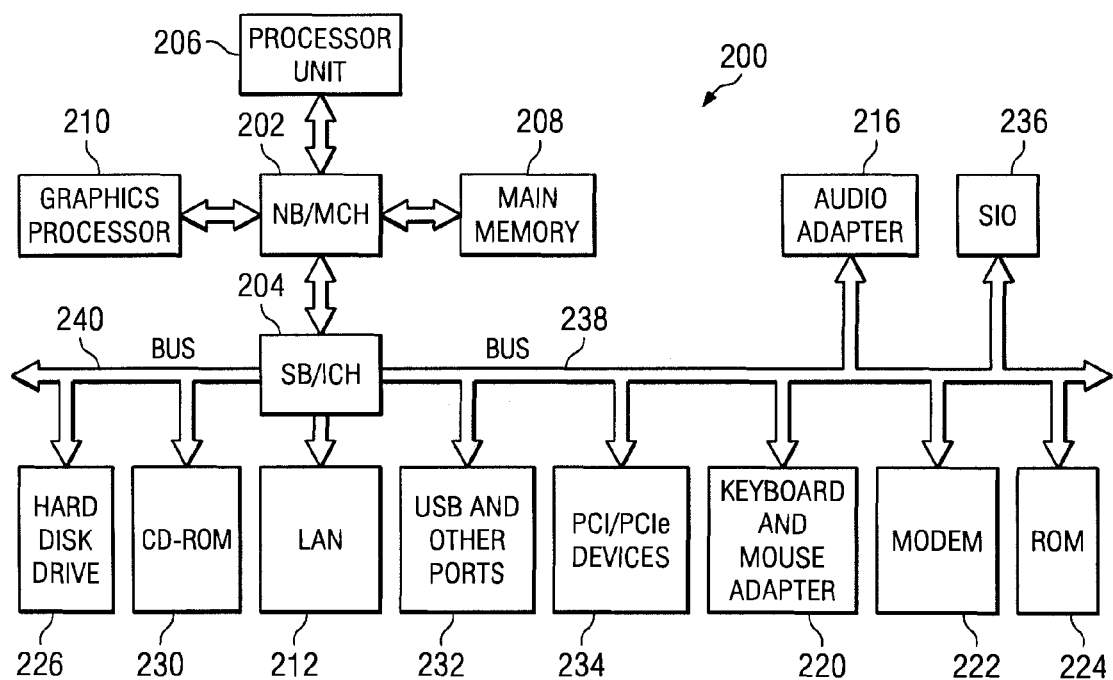
FIG. 2 is a block diagram of a data processing system in which illustrative embodiments may be implemented.

With reference now to FIG. 2, a block diagram of a data processing system is shown in which illustrative embodiments may be implemented. Data processing system 200 is an example of a computer, such as computer 100 in FIG. 1, in which code or instructions implementing the processes of the illustrative embodiments may be located. In the depicted example, data processing system 200 employs a hub architecture including a north bridge and memory controller hub (MCH) 202 and a south bridge and input/output (I/O) controller hub (ICH) 204. Processor 206, main memory 208, and graphics processor 210 are coupled to north bridge and memory controller hub 202. Graphics processor 210 may be coupled to the MCH through an accelerated graphics port (AGP), for example.

In the depicted example, local area network (LAN) adapter 212 is coupled to south bridge and I/O controller hub 204 and audio adapter 216, keyboard and mouse adapter 220, modem 222, read only memory (ROM) 224, universal serial bus (USB) ports and other communications ports 232, and PCI/PCIe devices 234 are coupled to south bridge and I/O controller hub 204 through bus 238, and hard disk drive (HDD) 226 and CD-ROM drive 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM drive 230 may use, for example, an integrated drive electronics (IDE) or serial advanced technology attachment (SATA) interface. A super I/O (SIO) device 236 may be coupled to south bridge and I/O controller hub 204.

An operating system runs on processor 206 and coordinates and provides control of various components within data processing system 200 in FIG. 2. The operating system may be a commercially available operating system such as Microsoft® Windows® XP (Microsoft and Windows are trademarks of Microsoft Corporation in the United States, other countries, or both). An object oriented programming system, such as the Java programming system, may run in conjunction with the operating system and provides calls to the operating system from Java programs or applications executing on data processing system 200 (Java and all Java-based trademarks are trademarks of Sun Microsystems, Inc. in the United States, other countries, or both).

Instructions for the operating system, the object-oriented programming system, and applications or programs are located on storage devices, such as hard disk drive 226, and may be loaded into main memory 208 for execution by processor 206. The processes for different embodiments may be performed by processor 206 using computer implemented instructions, which may be located in a memory such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may be comprised of one or more buses, such as a system bus, an I/O bus and a PCI bus. Of course the bus system may be implemented using any type of communications fabric or architecture that provides for a transfer of data between different components or devices attached to the fabric or architecture. A communications unit may include one or more devices used to transmit and receive data, such as a modem or a network adapter. A memory may be, for example, main memory 208 or a cache such as found in north bridge and memory controller hub 202. A processing unit may include one or more processors or CPUs. The depicted examples in FIGS. 1-2 and above-described examples are not meant to imply architectural limitations. For example, data processing system 200 also may be a tablet computer, laptop computer, or telephone device in addition to taking the form of a PDA.

The illustrative embodiments provide for a computer implemented method, apparatus, and computer usable program code for compiling source code. The methods in the depicted embodiments may be performed in a data processing system, such as data processing system 100 shown in FIG. 1 or data processing system 200 shown in FIG. 2.

Figure 3:
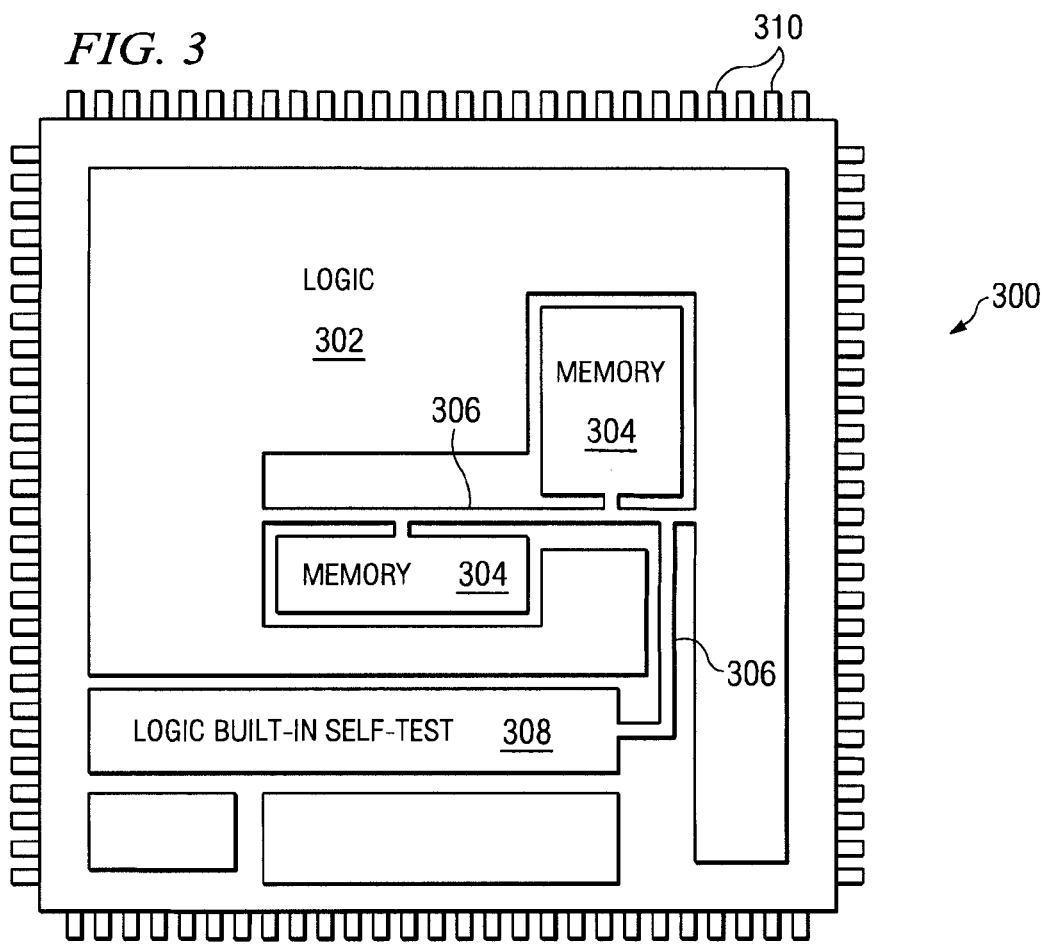
FIG. 3 is a block diagram of a computer chip with logic built-in self-test in accordance with an illustrative embodiment.

FIG. 3 is a block diagram of a computer chip with logic built-in self-test in accordance with an illustrative embodiment. FIG. 3 is a chip that may be used in any part of a data processing system, such as data processing system 200 of FIG. 2. Chip 300 may be a processor, communications component, memory, graphics component, or other data processing component. Chip 300 includes logic 302 that implements the functionality of chip 300. Chip 300 may or may not include memory 304. Memory 304 may be used to store, read, and write values in chip 300. Data is passed between memory 304 and logic 302 by bus 306. Logic built-in self-test 308 (LBIST) tests the functionality of chip 300 and ensures that logic 302 processes data properly.

For example, LBIST 308 may load a logic built-in self-test pattern from memory 304 into logic 302 for testing. The logic built-in self-test pattern includes multiple test values that are loaded into components within logic 302 for functional testing of logic 302. Chip 300 testing may be performed after manufacture, installation, at start-up, or to trouble shoot chip 300. Chip 300 passes the testing if the test data produced by logic 302 match the expected test results. The test results may be in the form of a final signature that is compared against an expected value. Pins 310 may be used to interconnect chip 300 with the data processing system or to interconnect chip 300 with other hardware components.

Chip 300 may include other components and modules necessary to perform the designated functionality. LBIST 308 contains the apparatus and processes of the illustrative embodiment.

Figure 4:
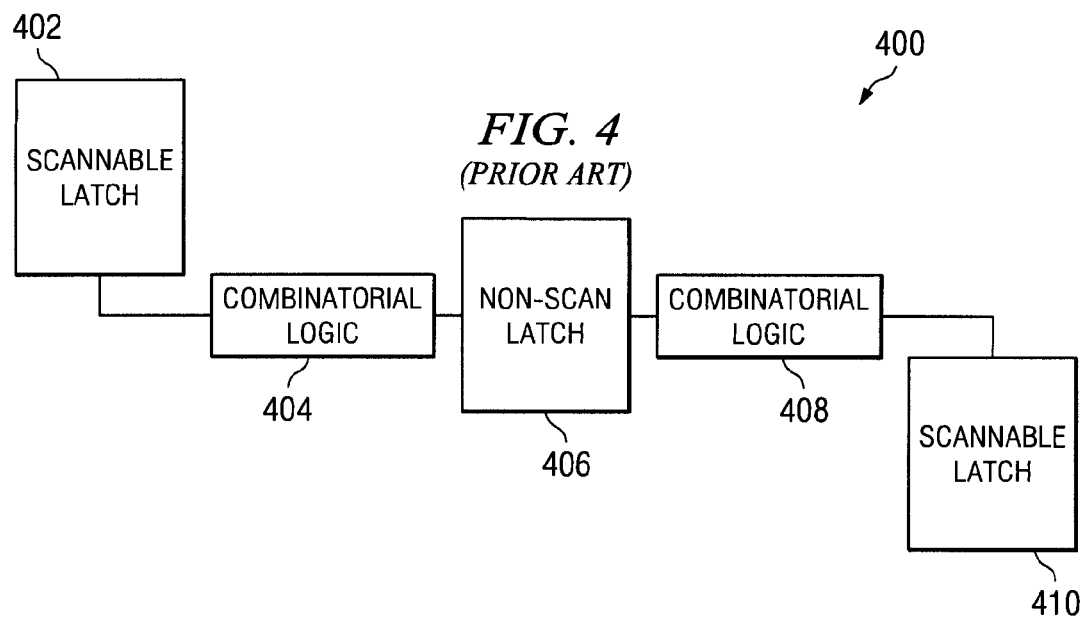
FIG. 4 is a block diagram for a current logic pipeline.

FIG. 4 is a block diagram for a conventional logic pipeline. Pipeline 400 is an example of different latches within a pipeline stage. Scannable latch 402 inputs data signals into combinatorial logic 404 which in turn inputs the signals to non-scan latch 406. Non-scan latch 406 inputs the signals to combinatorial logic 408, which in turn inputs the signals to scannable latch 410. The data signal is a logic high or a logic low corresponding to a 1 or a 0. The currently available systems allow up to three non-scan latches, such as non-scan latch 406 in pipeline 400 before a scannable latch, such as scannable latch 402 must be inserted. No feedback paths from non-scan latch 406 to its inputs are allowed nor may the output of non-scan latch 406 input to a non-scan latch input at an earlier stage of pipeline 400.

During logic built-in self-test testing, the scannable latches, such as scannable latch 402 are loaded or scanned with a test pattern value. Logic built-in self-test logic, such as LBIST 308 of FIG. 3, loads the test pattern in this example. For example, the pattern may be a set of binary values that produce known output results when passed through or processed by components of pipeline 400. Then the non-scan latches, such as non-scan latch 406, are loaded by clocking non-scan latch 406 to load the test pattern value from scannable latch 402 through combinatorial logic 408 to non-scan latch 406. In these examples, one clock pulse per non-scan stage is used to load the non-scan latches. After loading the non-scan latches, one or more clock cycles are run on all the latches to complete the testing using the pattern values. After the clock cycles are run on all the latches, the results of the test are scanned out by logic built-in self-test logic and the next test pattern is scanned in by logic built-in self-test logic.

To further clarify, the logic built-in self-test tests the functionality of pipeline 400 after loading test pattern values into the scannable latches. In these examples, the test pattern values are loaded during a channel fill operation. This additional operation is a non-scan latch fill step in which non-scan latch 406 is loaded from scannable latches, such as scannable latch 402, in a fixed number of cycles equal to the allowed depth of the non-scan pipeline 400. The fixed number of cycles ensure that non-scan latch 406 contain predictable values prior to the logic built-in self-test functional test.

In another implementation, additional non-scan latches load non-scan latches, such as non-scan latch 406. When other non-scan latches load non-scan latch 406, non-scan latch 406 cannot be any further than two latches in pipeline 400 away from another scannable latch. The proximity of non-scan latch 406 to scannable latch 402 ensures that enough cycles in length are present to allow all the non-scan latches in pipeline 400 to be loaded.

A functional test sequence tests non-scan latch 406 after non-scan latch has been loaded. The functional test sequence causes the normal logic paths including combinatorial logic 404 and combinatorial logic 408 to be exercised, with the result loaded into scannable latches, such as scannable latch 410. Typically the functional test runs for one, two, or three cycles prior to completion of the functional test sequence as directed by the logic built-in self-test. The channel fill operation also serves as a channel unload operation in which the state after the tests results of functional test sequence is captured in a component such as a multiple input signature register (MISR) as output from data out scannable latch 410. After the designated number of cycles or iterations has been run, the logic built-in self-test captures the tests results and compares the test results against the expected value to determine pass/fail. Test results are captured by reading the values in data out scannable latch 410. For example, the value stored in data out scannable latch 410 may be temporarily read and then stored in memory for comparison by logic built-in self-test.

Figure 5:
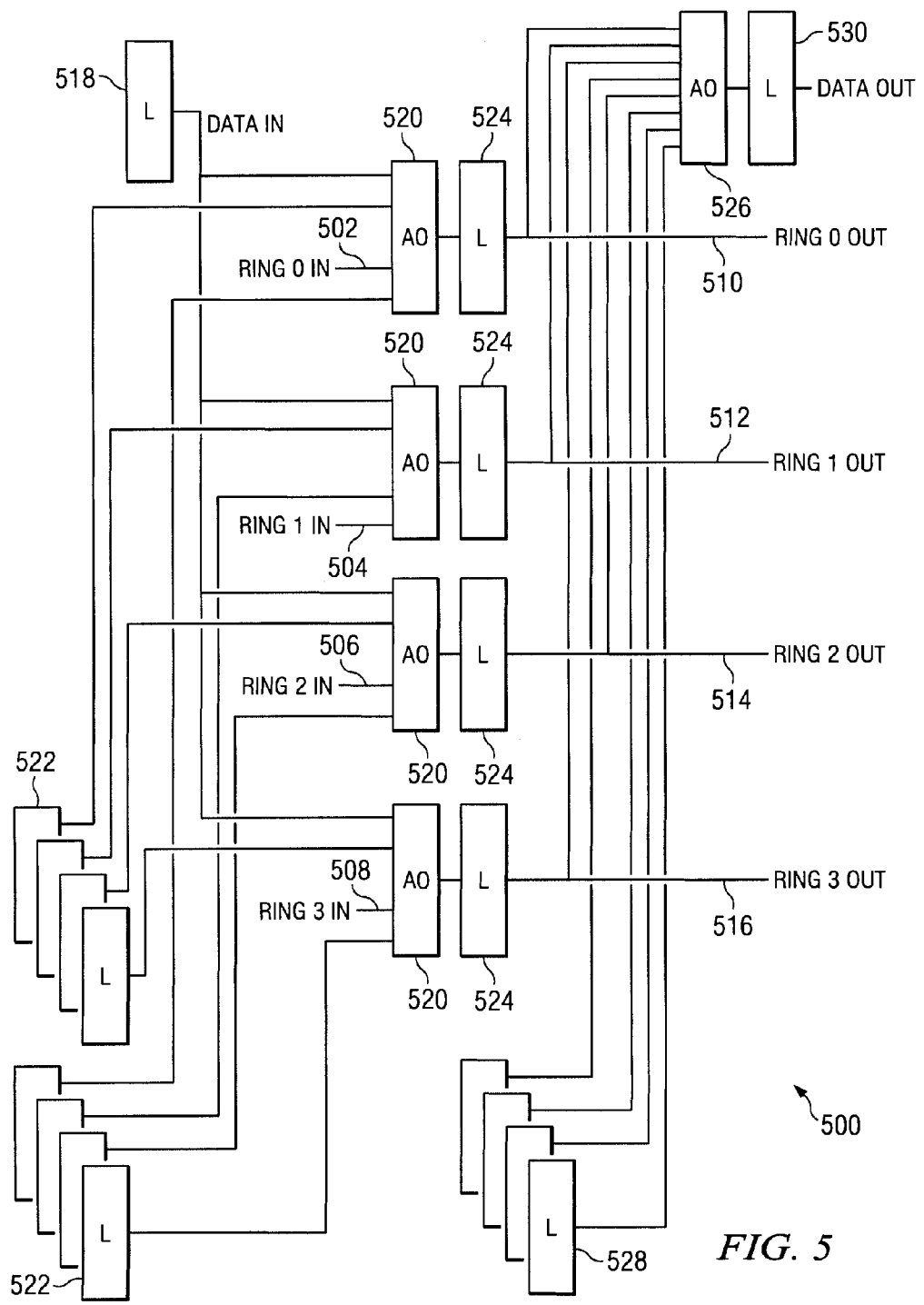
FIG. 5 is a block diagram for a non-scan latch stage in accordance with an illustrative embodiment.

FIG. 5 is a block diagram for a non-scan latch stage in accordance with an illustrative embodiment. Non-scan latch stage 500 includes various components including exemplary latches and logical gates. Non-scan latch 500 would be untestable when connected in a ring shown in FIG. 6A-6B. Non-scan latch stage 500 includes four rings each with an input and output through non-scan latch stage 500. The ring inputs include ring 0 in 502, ring 1 in 504, ring 2 in 506, and ring 3 in 508. The ring outputs include ring 0 out 510, ring 1 out 512, ring 2 out 514, and ring 3 out 516. Data in latch 518 is a scannable latch with inputs into logic gates 520. Logic gates 520 may be a multiplexor, AND, OR, NAND, NOR, XOR, or other common digital logical gates or combination of gates. Control latches 522 are scannable latches that input data into logic gates 520. Ring 0 in 502, ring 1 in 504, ring 2 in 506, and ring 3 in 508 are also input into logical gates 520.

Logical gates 520 output passes through ramp latches 524. Ramp latches 524 are non-scan latches. The output of ramp latches 524 passes to logical gate 526. Control latches 528 also have inputs into logical gate 526. The output of logical gate 526 passes to data out latch 530. Data out latch 530 is also a scannable latch.

Normal logic built-in self-test testing in full scan environments, such as non-scan latch stage 500, includes a channel fill operation. During the channel fill operation, scannable latches such as data in latch 518 may load values from a pseudo random pattern generator (PRPG). Simultaneously, test results or a signature of the prior test are read. The prior test results are typically ignored during the initial load.

Figure 6A:
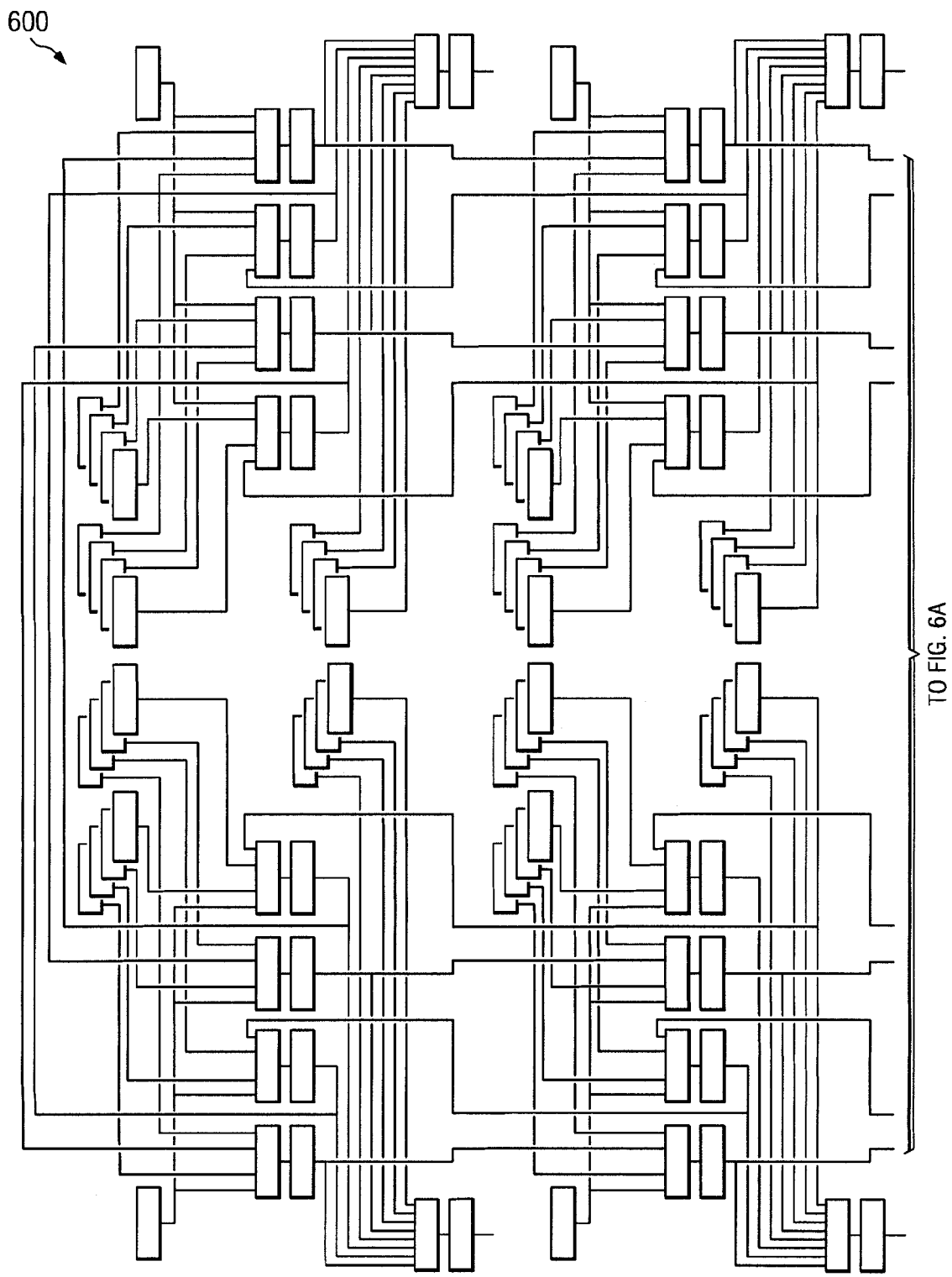
FIG. 6A-6B is a block diagram of a non-scan latch ring in accordance with an illustrative embodiment.
Figure 6B:
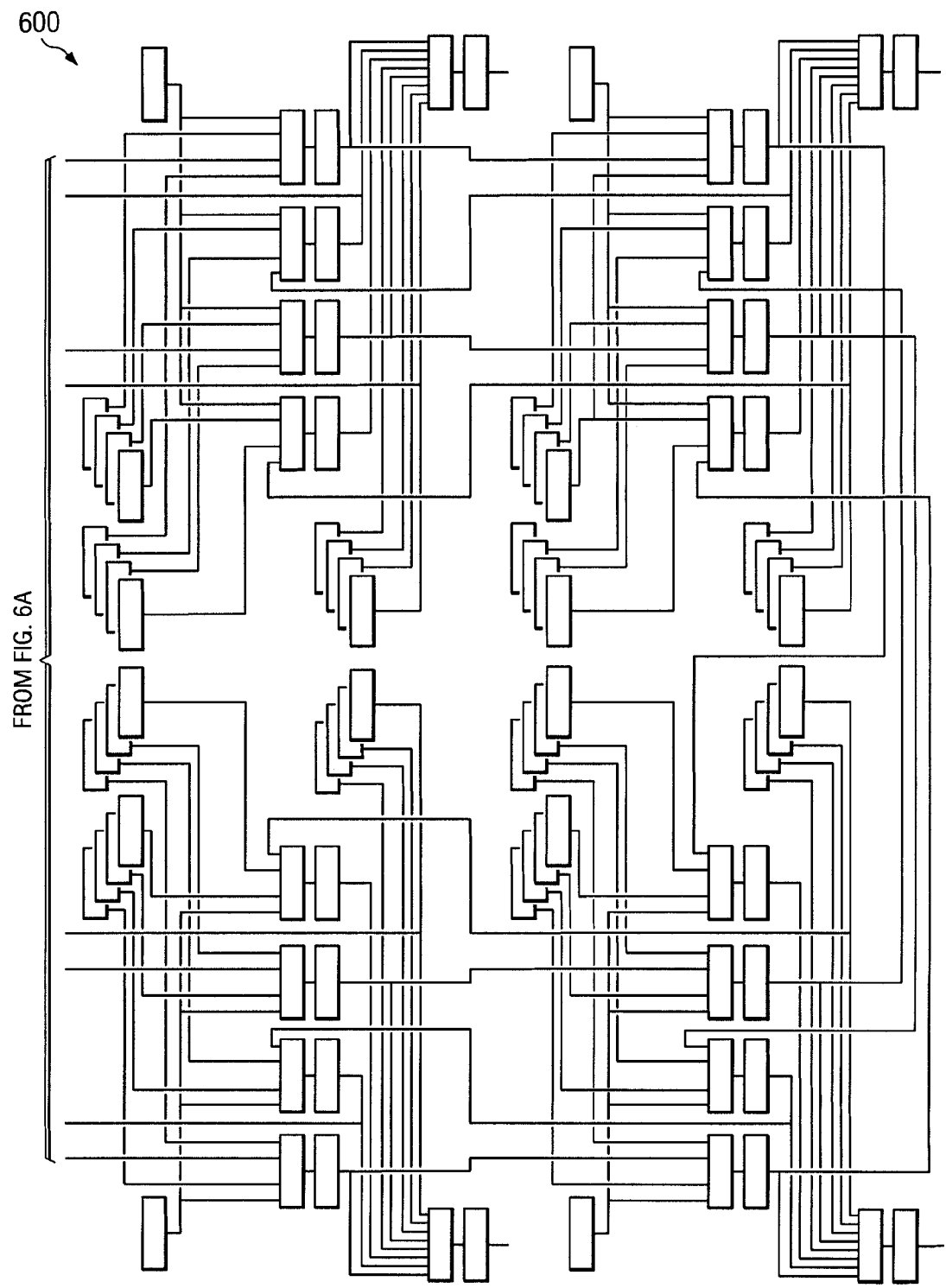

FIG. 6A-6B is a block diagram of a non-scan latch ring in accordance with an illustrative embodiment. Non-scan latch ring 600 includes a ring of non-scan latch stages, such as non-scan latch stage 500 of FIG. 5 interconnected in series to form a ring. The depth of non-scan latch ring 600 appears to be infinite because of the ring architecture as opposed to discrete non-scan latch stages or groups of interconnected non-scan latch stages.

Non-scan latch ring 600 is an exemplary non-scan latch loop. A ring or loop of non-scan latches may take involve different structures or forms in addition to that shown in these examples. Non-scan latch ring is distinguishable by a circular flow of data as outputs of latches, stages, or logic are inputs to other latches, stages or logic.

FIG. 7 is a block diagram of a non-scan latch stage for use with logic built-in self-test in accordance with an illustrative embodiment. Non-scan latch stage 700 may be implemented in a computer chip and more specifically in logic, such as chip 300 and logic 302 of FIG. 3 respectively. Non-scan latch stage 700 is interconnected in a ring to form a ring of non-scan latches, such as non-scan latch ring 600 of FIG. 6. This configuration is easily tested using a logic built-in self-test.

Logic built-in self-test control latch 702 and control latches 704 are input into logic block 706. Control latches 704 may be control elements, such as control latches 522 of FIG. 5. Logic built-in self-test control latch 702 is connected to logic block 706. Logic block 706 may be logical gates, such as logic gates 520 of FIG. 5. The output of logic block 706 provides a control signal to multiplexor 708. Logic built-in self-test control latch 702 is controlled directly by a logic built-in self-test engine, such as logic built-in self-test 308 of FIG. 3. Multiplexor 708 may be a logic gate, such as logic gate 526 of FIG. 5.

Multiplexor 708 has two inputs, input latch 710, a scannable latch, and ramp latch 712, a non-scan latch. Logic built-in self-test control latch 702 provides an override control signal that passes through logic block 706 forcing multiplexor 708 to pass the value in input latch 710 through to non-scan latch 714. As a result, at the beginning of a channel fill operation used to load a logic built-in self-test pattern value, a known value is loaded into input latch 710. Logic built-in self-test control latch 702 is used as a control signal to override control latches 704 in order to ensure that input latch 710, a scannable latch with a value of the logic built-in self-test pattern, is loaded into non-scan latch 714. The value in input latch 710 is passed through multiplexor 708 to non-scan latch 714 so that the logic built-in self-test sequence may begin. In other embodiments, logic built-in self-test control latch 702 may be replaced by a scannable latch or other logical component. Additionally, logic built-in self-test logic may be used to pass through the override control signal to logic block 706.

Various illustrative embodiments force a non-scan latch, such as non-scan latch 714 to load a value from a scannable latch, such as input latch 710 so that logic built-in self-test pattern values may be correctly loaded into non-scan latches interconnected in a ring.

In another illustrative embodiment, non-scan latch 714 may be forced to any known value prior to clocking or executing the first test. As a result, non-scan latch 714 receives the known value and immediately is ready for testing.

FIG. 8 is a timing diagram illustrating loading a non-scan latch in accordance with an illustrative embodiment. Timing diagram 800 corresponds to a non-scan latch stage, such as non-scan latch stage 700 of FIG. 7. Timing diagram 800 includes various signals, including clock 802, scan 804, scan latch clock enable 806, non-scan latch clock enable 808, and logic built-in self-test fill 810.

Timing diagram 800 also includes various periods associated with the various signals, including period 1 812, period 2 814, period 3 816, period 4 818, period 5 820. During period 1 812, the logic built-in self-test loads the test pattern and reads the prior test result. The test result is scanned and the pattern values loaded by a logic built-in self-test engine, such as logic built-in self-test 308 of FIG. 3. Period 2 814 represents the non-scan latch load. During this step logic built-in self-test fill 810 forces non-scannable latches to load from scannable logic.

As applied to an exemplary non-scan latch stage, such as non-scan latch stage 700 of FIG. 7, a control signal from logic built-in self-test control latch 702 may be used to pass a value in input latch 710 through multiplexor 708 to non-scan latch 714.

During period 3 816, logic built-in self-test performs a scan shift allowing the logic to be tested at speed during the test cycle of period 4 818. The normal logic paths are exercised during period 4 818. The test cycle of period 4 818 may be multiple cycles. For example, the test cycle is frequently less than four cycles. Period 5 820 is the same as period 1 812. The test result is read to the logic built-in self-test.

Figure 9:
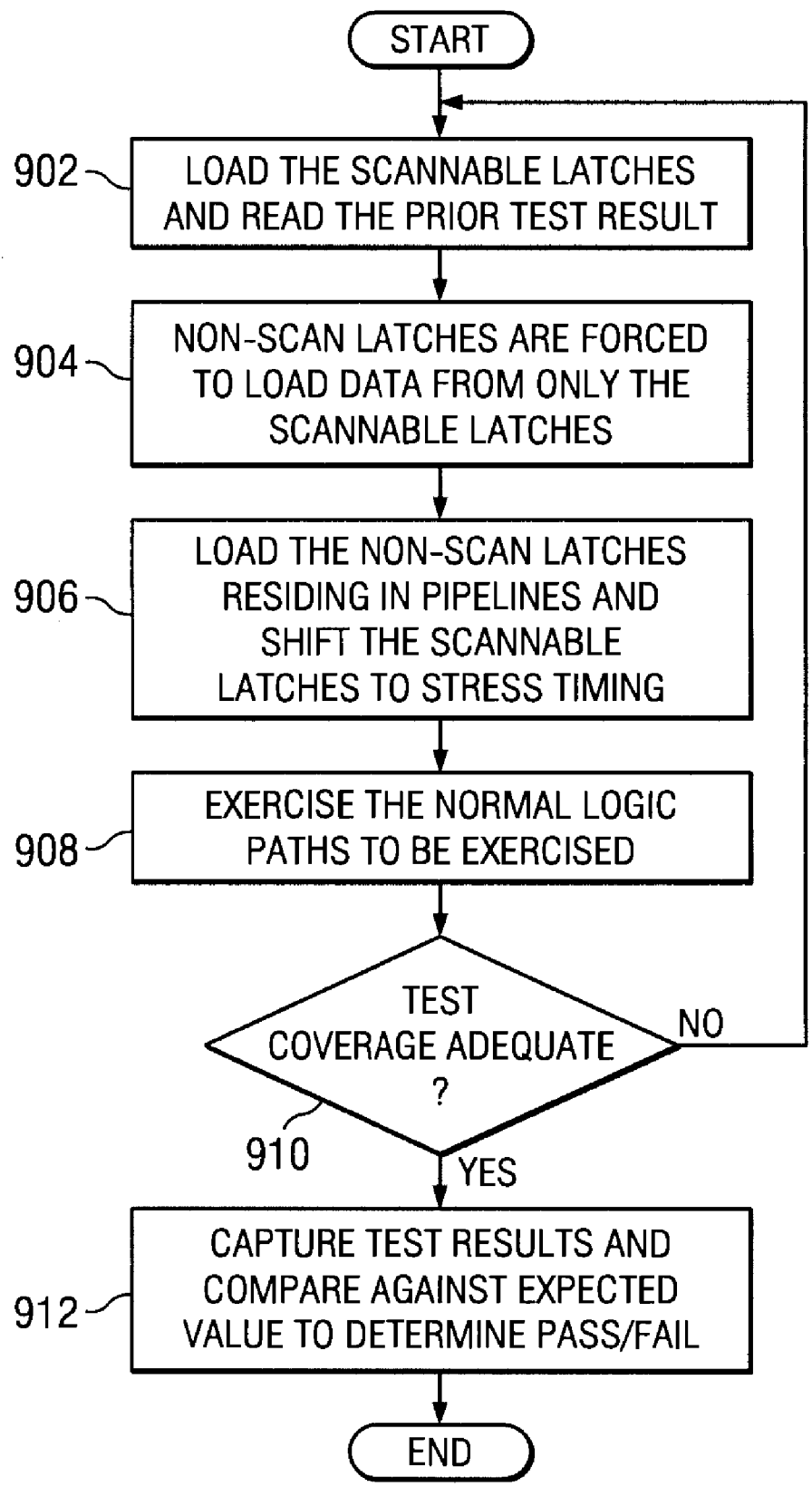
FIG. 9 is a flowchart for loading test pattern values in a non-scan latch ring in accordance with an illustrative embodiment.

FIG. 9 is a flowchart for loading test pattern values in a non-scan latch ring in accordance with an illustrative embodiment. FIG. 9 may be implemented in a interconnected ring of non-scan latch stages, such as non-scan latch stage 700 of FIG. 7. The non-scan latch stages may interconnect to form a ring of non-scan latches such as non-scan latch ring 600 of FIG. 6.

The process begins by the logic built-in self-test loading the scannable latches and reading the prior test result (step 902). The scannable latches are loaded with test pattern values that may be stored in the logic built-in self-test or in a memory controlled by the logic built-in self-test. For example, a logic 1 may be loaded into a scannable latch in step 902. The scannable latches may be input latches, such as input latch 710 of FIG. 7. The prior test results of the logic built-in self-test testing of the non-scan latch ring are ignored during step 902 the first time through the loop.

Next, the logic built-in self-test forces the non-scan latches to load data from only the scannable latches (step 904). Logic built-in self-test forces all non-scan latches with inputs that may come from both scannable and non-scannable latches to load data from only the scannable latches. A non-scan latch, such as logic built-in self-test control latch 702 may be used to force another non-scan latch, such as non-scan latch 714 of FIG. 7 to load a known value for the functional test. The non-scan latch may generate an override control signal that forces a test value through to the latch. For example, the override control signal may be used to force logic between the scannable latch and non-scan latch to pass through the test value stored in the scannable latch.

Next, the process loads the non-scan latches residing in pipelines and shifts the scannable latches to stress timing (step 906). By stressing timing, the timing response of all logic within the pipeline is tested for conflicts, errors, and unstable logic. As a result, any timing conflicts of components in the logic may cause a different value to be generated for the test results. Incorrect test results indicate that the logic is not functioning correctly for the designed purpose of the logic. Step 906 may be extended enough cycles to allow all the non-scan latches to be loaded for the functional test. The illustrative embodiments allow non-scan latches to be loaded from both non-scan latches and scannable latches. Additionally, non-scan latches within a ring of non-scan latches are not limited to be no more than two latches in the pipeline away from a scannable latch.

Next, the ring of non-scan latches exercise the normal logic paths to be exercised (step 908). Exercising normal logic paths refers to running or clocking the non-scan circuits as will occur during normal operation of the chip in which the non-scan circuit is embedded. By testing the normal logic paths in step 908, the logic built-in self-test ensures that the ring of non-scan latches produce correct results during practical use. Logic paths represent the different ways data may flow through the ring of non-scan latches. During step 908 the test result are loaded into scannable latches.

Next, the process determines if the test coverage is adequate (step 910). For example, a programmable limit may be used to control the number of iterations. The logic built-in self-test loop count may be established during design using a test tool. In one example, the test coverage is considered adequate when a number of executions exposes approximately 98 percent of all faults. The number of executions is used by the process in step 910 to ensure that the test coverage is adequate. If the test coverage is not adequate, the process returns to step 902. If the test coverage is adequate in step 910, the process captures the test results and compares against expected value to determine pass/fail (step 912). In these illustrative examples, steps 902-908 may be run for multiple cycles or loops prior to terminating the functional test based on the determination of step 910.

The various illustrative embodiments provide a computer implemented method and apparatus for testing a ring of non-scan latches with logic built-in self-test. Using additional logic built-in self-test logic, non-scan latches are forced to load a logic built-in self-test pattern value from upstream scannable latches. By loading from a non-scan latch or scannable latches, the ring of non-scan latches may be effectively tested using logic built-in self-test.

The illustrative embodiments can take the form of an entirely hardware embodiment, an entirely software embodiment or an embodiment containing both hardware and software elements. The illustrative embodiments are implemented in software, which includes but is not limited to firmware, resident software, microcode, etc.

Furthermore, the illustrative embodiments can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the illustrative embodiments have been presented for purposes of illustration and description, and is not intended to be exhaustive or limited to the illustrative embodiments in the form disclosed. Many modifications and variations will be apparent to those of ordinary skill in the art. The embodiment was chosen and described in order to best explain the principles of the illustrative embodiments, the practical application, and to enable others of ordinary skill in the art to understand the illustrative embodiments for various embodiments with various modifications as are suited to the particular use contemplated.

What is claimed is:

1. A ring of non-scan latches comprising:
    a plurality of non-scan latch stages, wherein the plurality of non-scan latch stages are interconnected to form the ring of non-scan latches, wherein the plurality of non-scan latch stages includes a plurality of non-scan latches;
    control logic operably connected to at least one of the plurality of non-scan latches, wherein during logic built-in self-test testing, an override control signal passed through the control logic forces the at least one of the plurality of non-scan latches to load a logic built-in self-test value from an input latch operably connected to the at least one of the plurality of non-scan latches, wherein the input latch is a scannable latch.

2. The ring of non-scan latches of claim 1, wherein the input latch connects to the at least one of the plurality of non-scan latches through a logic gate.

3. The ring of non-scan latches of claim 2, wherein the control logic connects to the at least one of the plurality of non-scan latches through a logic gate.

4. The ring of non-scan latches of claim 3, wherein the control logic controls the logic gate.

5. The ring of non-scan latches of claim 4, wherein the override control signal controls the control logic.

6. The ring of non-scan latches of claim 5, wherein the control logic and logic gate are a logical gate.

7. A data processing chip with logic built-in self-test comprising:
    digital logic, wherein the digital logic includes a ring of non-scan latches;
    a logic built-in self-test operably connected to the digital logic;
    wherein the logic built-in self-test in the ring of non-scan latches asserts an override control signal in response to a scannable latch being loaded with a logic built-in self-test value, wherein the override control signal forces a non-scan latch to load the logic built-in self-test value from the scannable latch for verifying functionality of the ring of non-scan latches and the corresponding digital logic.

8. The data processing chip of claim 7, wherein the chip is any of a processor, communications component, memory, or graphics component.

9. The data processing chip of claim 7, wherein the non-scan latch is forced to any known value prior to clocking a first logic built-in self-test pattern for immediately testing the ring of non-scan latches.

10. The data processing chip of claim 7, further comprising:
    a memory operably connected to the digital logic for storing and accessing a logic built-in self-test pattern;
    wherein the logic built-in self-test value is a part of the logic built-in self-test pattern.

11. The data processing chip of claim 7, wherein a logical gate is operably connected as an input to the non-scan latch.

12. The data processing chip of claim 11, wherein the override control signal forces the logical gate to pass the logic built-in self-test value from the scannable latch to the non-scan latch.

13. The data processing chip of claim 12, wherein the logical gate is any of an AND, OR, NAND, XOR, and multiplexor.

14. The data processing chip of claim 7, wherein results of the logic built-in self-test are captured from the non-scan latch.

* * * * *